(12) United States Patent
Iwamizu et al.

(10) Patent No.: US 10,103,539 B2
(45) Date of Patent: Oct. 16, 2018

(54) SEMICONDUCTOR DEVICE AND CURRENT LIMITING METHOD

(71) Applicant: FUJI ELECTRIC CO., LTD., Kawasaki-shi (JP)

(72) Inventors: Morio Iwamizu, Matsumoto (JP); Shigeyuki Takeuchi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 419 days.

(21) Appl. No.: 14/934,744

(22) Filed: Nov. 6, 2015

(65) Prior Publication Data

US 2016/0181792 A1    Jun. 23, 2016

(30) Foreign Application Priority Data

Dec. 17, 2014 (JP) ................................ 2014-254868

(51) Int. Cl.
  *H02H 9/08* (2006.01)
  *H02H 9/02* (2006.01)
  *H03K 17/082* (2006.01)

(52) U.S. Cl.
  CPC ........... *H02H 9/02* (2013.01); *H03K 17/0822* (2013.01); *H03K 2217/0027* (2013.01)

(58) Field of Classification Search
  USPC ....................................................... 361/93.9
  See application file for complete search history.

(56) References Cited

U.S. PATENT DOCUMENTS

| 5,272,392 | A | * | 12/1993 | Wong ................... H03K 17/063 |
| | | | | 327/109 |
| 5,303,110 | A | | 4/1994 | Kumagai |
| 5,473,276 | A | | 12/1995 | Throngnumchai |
| 5,642,252 | A | * | 6/1997 | Sakamoto ........... H01L 27/0248 |
| | | | | 257/E29.257 |
| 6,347,028 | B1 | * | 2/2002 | Hausman, Jr. ..... H03K 17/0822 |
| | | | | 323/276 |
| 7,259,951 | B2 | | 8/2007 | Arai |
| 9,871,513 | B2 | * | 1/2018 | Iwamizu .............. H03K 17/687 |

(Continued)

FOREIGN PATENT DOCUMENTS

| EP | 0599605 A2 | 6/1994 |
| JP | H8316472 A | 11/1996 |

(Continued)

*Primary Examiner* — Ronald W Leja
(74) *Attorney, Agent, or Firm* — Rabin & Berdo, P.C.

(57) ABSTRACT

A semiconductor device, including a main transistor configured to supply power from a power source to a load, and a current limiting device including a control transistor. The current limiting device is configured to detect that the current flowing from the main transistor is an overcurrent, and to limit the current upon determining that the current is equal to or greater than a current limit value, and an operating voltage of the control transistor is equal to or greater than a current limiting activation voltage. The current limit value is a threshold for determining whether the current is greater than an operating current of the main transistor for the load to operate in a steady state. The current limiting activation voltage is a sum of a correction voltage and a predetermined threshold voltage at the gate of the control transistor when the current rises to the current limit value.

9 Claims, 8 Drawing Sheets

(56) References Cited

U.S. PATENT DOCUMENTS

| | | | |
|---|---|---|---|
| 2005/0200398 A1 | 9/2005 | Arai | |
| 2007/0064368 A1* | 3/2007 | Ohshima | H03K 17/0822 361/93.1 |
| 2009/0284885 A1* | 11/2009 | Kojima | H03K 17/0822 361/93.1 |
| 2010/0052647 A1* | 3/2010 | Forghani-zadeh | H02H 9/025 323/349 |
| 2013/0063188 A1 | 3/2013 | Sogo et al. | |
| 2013/0193939 A1* | 8/2013 | Sakaguchi | H02H 9/02 323/277 |
| 2013/0257517 A1 | 10/2013 | Kawashima | |
| 2013/0321966 A1* | 12/2013 | Syngaevskiy | H02H 3/093 361/87 |
| 2014/0085762 A1 | 3/2014 | Shimano et al. | |
| 2014/0184183 A1 | 7/2014 | Tanaka et al. | |
| 2014/0268458 A1* | 9/2014 | Luciani | H02H 3/10 361/86 |
| 2016/0181792 A1* | 6/2016 | Iwamizu | H03K 17/0822 361/93.9 |
| 2016/0365852 A1* | 12/2016 | Iwamizu | H02M 3/07 |

FOREIGN PATENT DOCUMENTS

| | | |
|---|---|---|
| JP | 2005-260658 A | 9/2005 |
| JP | 2012-249481 A | 12/2012 |
| JP | 2013-062730 A | 4/2013 |
| JP | 2014-128005 A | 7/2014 |
| JP | 5590240 B2 | 9/2014 |

* cited by examiner

SEMICONDUCTOR DEVICE AND CURRENT LIMITING METHOD

CROSS REFERENCE TO RELATED APPLICATION

This application claims the priority of a corresponding Japanese patent application, Serial No. JP PA 2014-254868, filed Dec. 17, 2014, the entire content of which is hereby incorporated by reference.

BACKGROUND OF THE INVENTION

1. Field of the Invention

The present invention relates to a semiconductor device and a current limiting method.

2. Description of the Background Art

The development of a semiconductor device called an intelligent power switch (IPS), wherein a power semiconductor element, and a control circuit, a protective circuit, and the like on the periphery thereof, are integrated on a single chip or in a single package has been advancing in recent years.

As IPS's are widely used in automobile electrical systems such as transmissions, engines, and brakes, there is a demand for products that provide size reduction, increased performance, and increased reliability.

A semiconductor device including a current detection unit having current detecting characteristics that are linear and have negative dependency with respect to the drain-to-source voltage of a main transistor has been proposed as existing technology (JP-A-2014-128005).

Also, technology whereby the output voltage of a variable voltage source is adjusted in accordance with the temperature in the vicinity of a power semiconductor device and the current flowing through a sense terminal, thereby correcting a difference between the characteristics of a main region and a sense region of the power semiconductor device, has been proposed (Japanese Patent No. 5,590, 240).

Furthermore, technology whereby a semiconductor device protective operation is carried out when the main current of the semiconductor device reaches a trip level, and the trip level is lowered when a semiconductor device activation operation is carried out, has been proposed (JP-A-2013-62730).

SUMMARY OF THE INVENTION

A function that carries out current limitation in order to restrict current flowing to excess (overcurrent) when a load short-circuits is provided in an IPS. The current limiting function is such that, when the current flowing from the power semiconductor element inside the IPS flows at or above a threshold (overcurrent limit value) set in advance, the occurrence of overcurrent is detected, and the amount of current is limited.

Meanwhile, a load such as a motor has the characteristic that an inrush current flows when the load starts up. In an IPS, in order to stably start up this kind of load, the overcurrent limit value is set higher than the maximum momentary value of the inrush current in order that no current limit is imposed on the inrush current.

However, when the overcurrent limit value is set higher than the maximum momentary value of the inrush current, there is a problem in that a current value that is lower than the maximum momentary value of the inrush current is difficult to detect as an overcurrent, and the overcurrent detection accuracy decreases.

The invention, having been contrived in consideration of this point, provides a semiconductor device and a current limiting method such that stable load start-up and an increase in overcurrent detection accuracy are achieved.

In order to resolve the heretofore described problem, a semiconductor device is provided. The semiconductor device includes a main transistor that carries out a supply of power from a power source to a load, and a current limiting unit, including a control transistor that controls the gate voltage of the main transistor, that has a current limiting function that limits the current flowing through the main transistor.

Also, the current limiting unit has a current limit value for determining that a current greater than the operating current when the load operates in a steady state is flowing. Further, the current limiting unit detects that an overcurrent is flowing from the main transistor, and activates the current limiting function, when the current flowing through the main transistor is equal to or greater than the current limit value and an operating voltage when turning on the control transistor is equal to or greater than a current limiting activation voltage, which is a correction voltage added to a predetermined voltage generated at the gate of the control transistor when the current flowing through the main transistor rises as far as the current limit value.

Stable load start-up and an increase in overcurrent detection accuracy can be achieved.

DETAILED DESCRIPTION OF THE INVENTION

Hereafter, embodiments of the invention will be described with reference to the drawings. Redundant descriptions may be omitted by components having essentially the same functions being given the same reference signs in the specification and drawings.

First Embodiment

Figure 1:
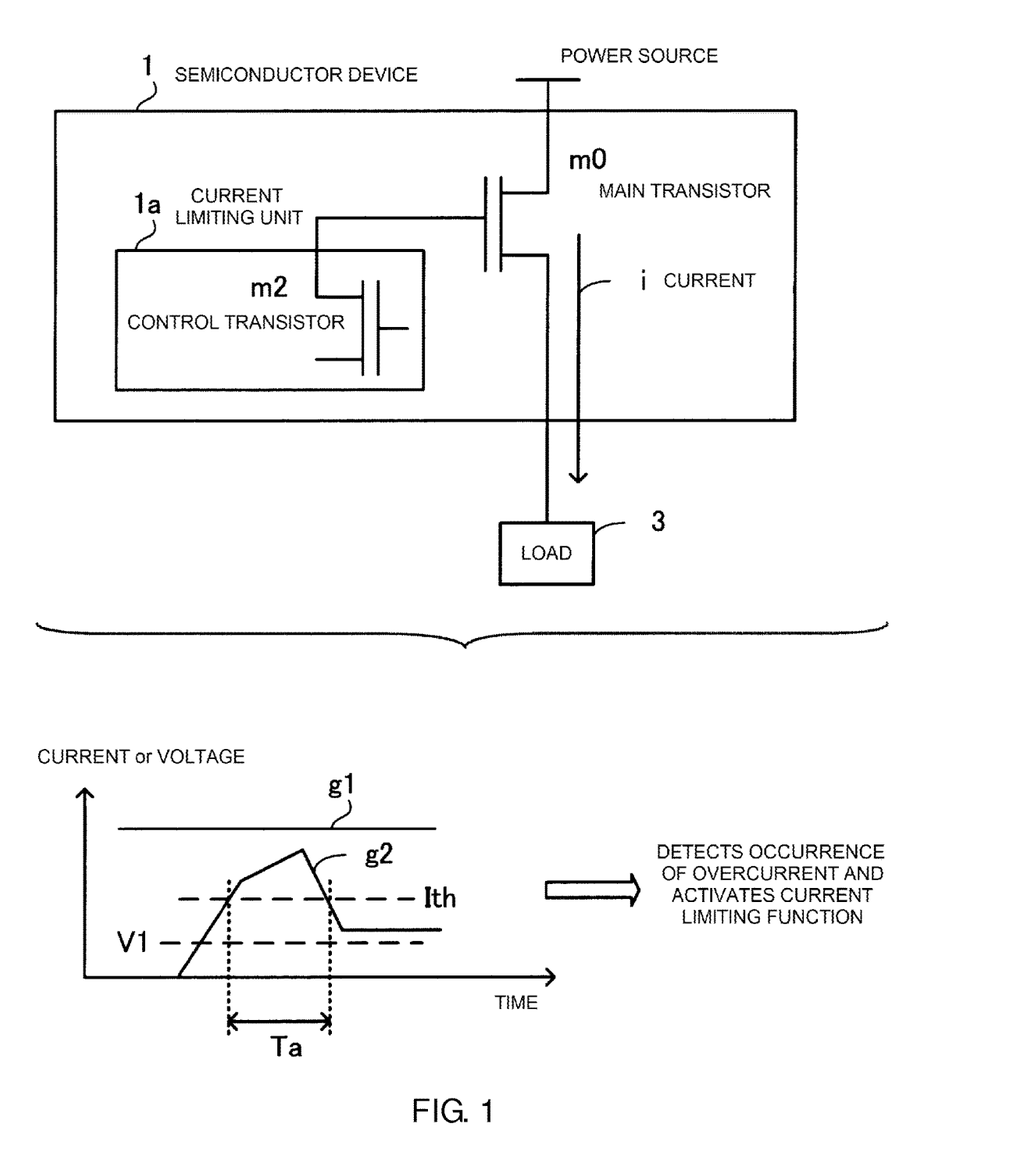
FIG. 1 is a diagram showing a configuration example of a semiconductor device.

FIG. 1 is a diagram showing a configuration example of a semiconductor device. A semiconductor device 1 of a first embodiment includes a main transistor m0 and a current limiting unit 1a, and the semiconductor device 1 is connected via the main transistor m0 to a load 3.

The main transistor m0 carries out a supply of power to the load 3. The current limiting unit 1a includes a control transistor m2 that controls the gate voltage of the main transistor m0, and has a current limiting function of controlling a current i flowing through the main transistor m0.

Also, the current limiting unit 1a has a current limit value Ith for determining that a current (large current) greater than the operating current when the load 3 operates in a steady state is flowing.

Furthermore, when the current i flowing through the main transistor m0 is equal to or greater than the current limit value Ith, and the operating voltage of the control transistor m2 is equal to or greater than a current limiting activation voltage V1, the current limiting unit 1a detects that an overcurrent is flowing from the main transistor m0, and activates the current limiting function.

The operating voltage of the control transistor m2 is voltage for driving the current limiting function (and can also be said to be the operating voltage of the current limiting unit 1a). Also, the current limiting activation voltage V1 is voltage wherein a correction voltage is added to a predetermined voltage generated at the gate of the control transistor m2 when the current flowing through the main transistor m0 rises as far as the current limit value Ith (to be described hereafter).

Herein, the waveform shown in FIG. 1 is for describing an operation of the current limiting unit 1a, wherein the vertical axis is current or voltage, and the horizontal axis is time. Graph g1 shows the operating voltage of the control transistor m2, while Graph g2 shows the current i flowing from the main transistor m0 to the load 3.

In a time period Ta, the current i flowing through the main transistor m0 is equal to or greater than the current limit value Ith, and the operating voltage is equal to or greater than the current limiting activation voltage V1. When these two conditions are both met, the current limiting unit 1a detects that an overcurrent is flowing from the main transistor m0, and activates the current limiting function in order to restrict the overcurrent. Conversely, when the two conditions are not met, the current limiting function is not activated.

In this way, the current limiting unit 1a of the semiconductor device 1, when detecting that an overcurrent is flowing from the main transistor m0, activates a current limiting function that restricts the overcurrent.

Also, the current limiting function is activated when two conditions are met, those being that the current i flowing through the main transistor m0 is equal to or greater than the current limit value Ith, and that the operating voltage of the control transistor m2 is equal to or greater than the current limiting activation voltage V1. According to this kind of semiconductor device 1 configuration, stable start-up of the load 3 and an increase in overcurrent detection accuracy can be achieved.

Next, before describing the details of the invention, a description will be given, using FIGS. 2 to 4, of a general configuration and operations of an IPS and of a problem to be resolved.

IPS Configuration and Operations

Firstly, a description will be given of a configuration and operations of a high-side type IPS, wherein a semiconductor device is disposed on the power supply side and a load is disposed on the GND (Ground) side.

Figure 2:
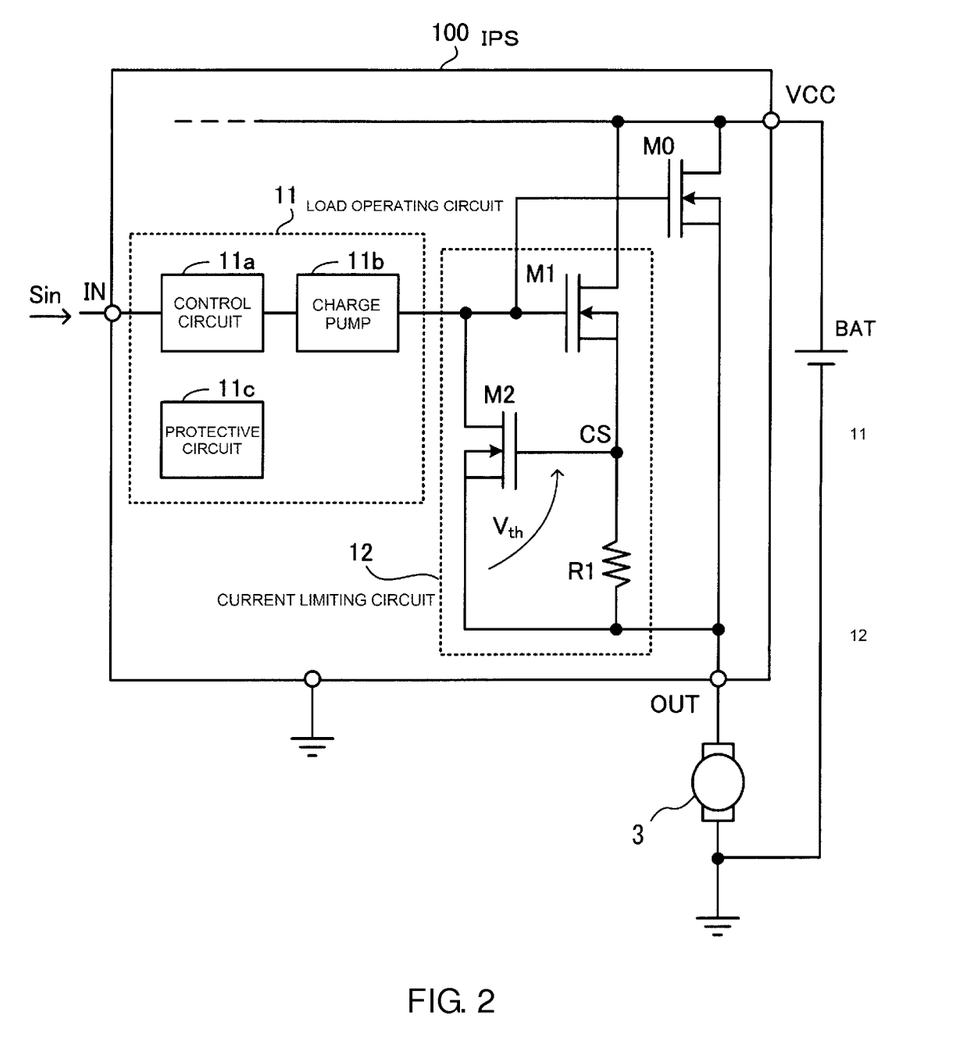
FIG. 2 is a diagram showing a configuration example of an IPS.
Figure 3:
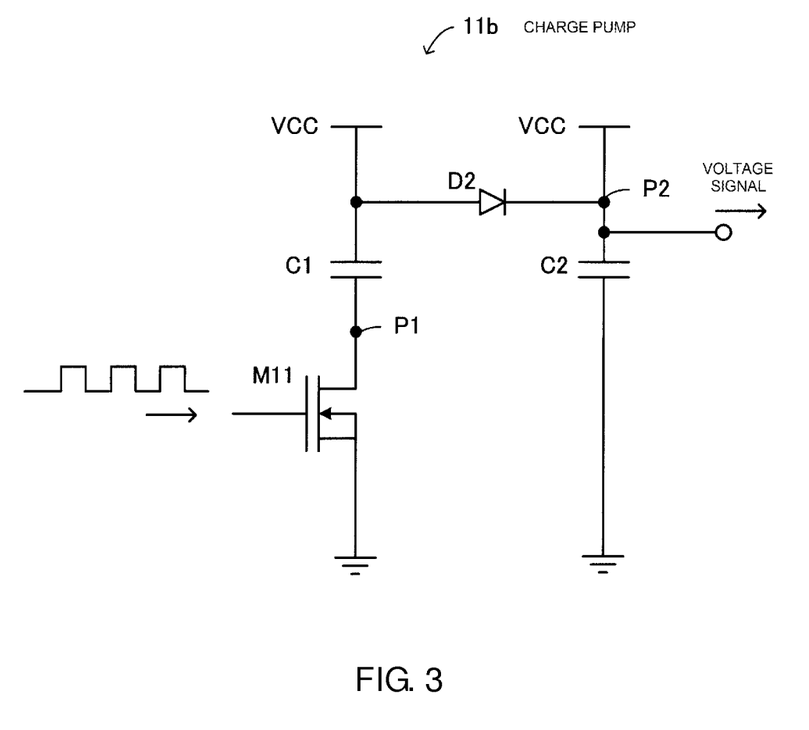
FIG. 3 is a diagram for describing a charge pump step-up operation.

FIG. 2 is a diagram showing a configuration example of an IPS. An IPS 100 is a semiconductor device including a load operating circuit 11, a current limiting circuit 12, and a transistor M0, and causes the load 3 to operate using current output from an output terminal OUT. The load 3 is an L load (inductive load) such as a motor, solenoid, or relay.

The load operating circuit 11 includes a control circuit 11a, a charge pump (step-up circuit) 11b, and a protective circuit 11c. Also, the current limiting circuit 12 includes transistors M1 and M2, and a resistor R1.

The transistor M0 is a power semiconductor element for which, for example, a power metal-oxide-semiconductor field effect transistor (MOSFET) is used. N-channel MOSFETs, for example, are used for the transistors M0 to M2.

Regarding the element connection relationships, an input port of the control circuit 11a is connected to an input terminal IN of the IPS 100, while an output port of the control circuit 11a is connected to an input port of the charge pump 11b.

An output port of the charge pump 11b is connected to the gate of the transistor M0, the gate of the transistor M1, and the drain of the transistor M2. The drains of the transistors M0 and M1 are connected to a power supply voltage terminal VCC of the IPS 100.

The source of the transistor M1 is connected to the gate of the transistor M2 and one end of the resistor R1. The source of the transistor M2 is connected to the other end of the resistor R1, the output terminal OUT of the IPS 100, and the source of the transistor M0.

The output terminal OUT is connected to one end of the load 3, which is a motor or the like, while the power supply voltage terminal VCC is connected to the positive terminal of a battery BAT. The negative terminal of the battery BAT is connected to the other end of the load 3 and GND.

In the following description, the transistor M0 is also called the main transistor M0, and the transistor M1 the sense (detecting) transistor M1. Furthermore, the transistor M2, which is a gate voltage controlling transistor, is also called the control transistor M2, and the resistor R1 the sense resistor R1.

Herein, the control circuit 11a, on receiving an input signal Sin transmitted from upstream (for example, an engine control unit (ECU)) via the input terminal IN, carries out a level comparison of the input signal Sin and a threshold set inside the circuit, and controls the charge pump 11b in accordance with the comparison result.

For example, when the level of the input signal Sin exceeds the threshold level, the control circuit 11a determines that the load 3 is to be caused to operate, and controls the charge function of the charge pump 11b to an enable state in order to turn on the main transistor M0.

Also, when the level of the input signal Sin drops under the threshold level, the control circuit 11a determines that operation of the load 3 is to be stopped, and controls the charge function of the charge pump 11b to a disable state in order to turn off the main transistor M0.

When the charge function is enabled by the control circuit 11a, the charge pump 11b generates and outputs a voltage signal having a voltage higher than the power supply voltage VCC. That is, the charge pump 11b generates the voltage necessary in order to cause the main transistor M0 to reach a complete on-state (full-on state), and applies the voltage to the gate of the main transistor M0.

The protective circuit 11c is a circuit for protecting each internal circuit of the IPS 100, detects overvoltage, overheat, or the like, and carries out a protective process based on the detection result. For example, when the protective circuit 11c detects that the device is in an overheated state, the protective circuit 11c stops the drive of the charge pump 11b.

The current limiting circuit 12 carries out control for limiting current flowing from the source of the main transistor M0 toward the load 3. For example, when the load 3 is short-circuited, or the like, the current limiting circuit 12 carries out protection while the load is short-circuited by carrying out current limitation so that no overcurrent flows.

The main transistor M0 outputs a predetermined current necessary in order to cause the load 3 to operate, and causes the current to flow to the load 3 via the output terminal OUT, in response to the voltage output from the charge pump 11b being applied to the gate of the main transistor M0.

The gate of the main transistor M0 and the gate of the sense transistor M1 are connected to each other. Therefore, when the charge pump 11b is in an enable state, the same gate voltage is applied to the main transistor M0 and sense transistor M1, and both are turned on.

However, as the current flowing through the main transistor M0 and the current flowing through the sense transistor M1 are determined based on a sense ratio, the current amounts differ from each other.

For example, when taking the current flowing through the sense transistor M1 (referred to as $I_{M1}$) when both are turned on to be 1, the current flowing through the main transistor M0 (referred to as $I_{M0}$) is in the region of 10,000, so the sense ratio $I_{M1}:I_{M0}=1:10,000$.

Consequently, current from both the main transistor M0 and sense transistor M1 is output from the output terminal OUT but, as heretofore described, the main current that causes the load 3 to operate is the current flowing from the main transistor M0.

Next, a step-up operation of the charge pump 11b will be described. FIG. 3 is a diagram for describing a charge pump step-up operation. The charge pump 11b includes an n-channel MOS (metal-oxide-semiconductor) transistor M11, a diode D2, and capacitors C1 and C2.

Regarding the element connection relationships, one end of the capacitor C1 is connected to the power supply voltage VCC and the anode of the diode D2, while the other end of the capacitor C1 is connected to the drain of the transistor M11.

One end of the capacitor C2 is connected to the power supply voltage VCC and the cathode of the diode D2, while the other end of the capacitor C2 and the source of the transistor M11 are connected to GND.

Herein, for example, a pulse signal switching repeatedly between an H level and an L level is applied to the gate of the transistor M11. When the pulse signal is at the H level, the transistor M11 is turned on.

In this case, the capacitor C1 is charged from the power supply voltage VCC (the capacitor C1 is charged until the terminal voltage thereof reaches VCC).

Meanwhile, when the pulse signal is at the L level, the transistor M11 is turned off, because of which the potential of a point P1 rises beyond the potential when the transistor M11 is in an on-state. Therefore, the charge accumulated in the capacitor C1 flows via the diode D2 to the capacitor C2.

At this time, charging by the power supply voltage VCC, and by a charge equivalent to VCC flowing from the capacitor C1, is carried out in the capacitor C2, because of which the potential of a point P2 rises as far as two times VCC.

Using this kind of configuration, the charge pump 11b generates a voltage signal sufficient to turn the main transistor M0 fully on. In principle, when carrying out step-up of n times VCC, n stages of the heretofore described kind of circuit configuration are provided.

Next, using FIG. 2, a description will be given of a normal operating mode and current limiting operating mode of the current limiting circuit 12. The normal operating mode is an operation at a time of normal operation, wherein no overcurrent occurs (there is no short-circuiting of the load 3), and the predetermined current is caused to flow from the main transistor M0 to the load 3.

Also, the current limiting operating mode is an operation limiting the current flowing from the main transistor M0 to the load 3 when in a state wherein the load 3 short-circuits and an overcurrent flows.

Firstly, the normal operating mode will be described. As heretofore described, the amount of current flowing through the sense transistor M1 is extremely small in comparison with the amount of current flowing from the main transistor M0.

Therefore, when the load 3 is operating normally, the potential of a current sense point CS connected to the source of the sense transistor M1 does not rise so far as to exceed the threshold voltage of the control transistor M2.

Hereafter, the current sense point CS will be called simply the point CS. Also, the voltage of the point CS will be referred to as CS voltage $V_{CS}$, and the threshold voltage of the control transistor M2 will be referred to as $V_{th}$.

As the point CS is connected to the gate of the control transistor M2, the control transistor M2 is in an off-state when the CS voltage $V_{CS}$ does not exceed the threshold voltage $V_{th}$ of the control transistor M2.

Therefore, a stepped-up voltage signal output from the charge pump 11b is applied as it is to the gate of the main transistor M0 in the normal operating mode, because of which the predetermined current for causing the load 3 to operate flows from the main transistor M0.

Next, the current limiting operating mode will be described. When the load 3 short-circuits, the output terminal OUT takes on the GND potential, and an overcurrent flows from the main transistor M0 via the output terminal OUT. When an overcurrent flows, there is concern that malfunction or destruction of peripheral parts will occur due to battery voltage fluctuation or overcurrent conduction, because of which overcurrent restriction is carried out.

When an overcurrent flows from the main transistor M0, current greater than the current flowing in the normal operating mode flows into the sense transistor M1 too.

In this case, the CS voltage $V_{CS}$ of the point CS connected to the source of the sense transistor M1 rises beyond the potential of the normal operating mode, but when the CS voltage $V_{CS}$ rises so far as to exceed the threshold voltage $V_{th}$ of the control transistor M2, the control transistor M2 switches to an on-state.

The drain of the control transistor M2 is connected to the output port of the charge pump 11b. Consequently, when the control transistor M2 is in an on-state, the control transistor M2 extracts an electrical charge in the form of a gate current from the capacitance inside the charge pump 11b internally connected to the output port of the charge pump 11b. Therefore, the gate voltage of the main transistor M0 drops.

When the gate voltage of the main transistor M0 drops, the current flowing from the main transistor M0 is limited, and the previously excessive amount of current decreases. Overcurrent is restricted by this kind of current limiting operation.

When the load 3 short-circuits and an overcurrent flows through the main transistor M0 in this way, the CS voltage $V_{CS}$ of the point CS on the upstream side of the sense resistor R1 rises. At this time, in the current limiting operating mode, the current flowing through the main transistor M0 is limited by the control transistor M2 being turned on, thereby controlling the gate voltage of the main transistor M0.

Next, conditions for driving in the current limiting operating mode will be described. There are two conditions for the current limiting circuit 12 of the IPS 100 to enter the current limiting operating mode.

The first condition is that the current flowing from the main transistor M0 exceeds an overcurrent limit value set in advance. The overcurrent limit value is a threshold seen to be an overcurrent with respect to the current flowing from the main transistor M0, and is the minimum value of an overcurrent.

By determining the overcurrent limit value, meaning what degree of current flowing from the main transistor M0 is seen to be an overcurrent, the resistance value of the sense resistor R1 is determined.

Herein, the relationship between the CS voltage $V_{CS}$ of the point CS, a resistance value $R_1$ of the sense resistor R1, and the current $I_{M1}$ flowing through the sense transistor M1, according to Ohm's Law, is as in the following Expression 1.

$$V_{CS} = R_1 \cdot I_{M1} \qquad 1$$

When the CS voltage $V_{CS}$ becomes equal to or greater than the threshold voltage $V_{th}$ of the control transistor M2 ($V_{CS} \geq V_{th}$) in the current limiting operating mode, the control transistor M2 is turned on.

In this case, when the resistance value $R_1$ of the sense resistor R1 is small, $V_{CS} \geq V_{th}$ is not established unless the current $I_{M1}$ flowing through the resistor R1 is large, as is clear from Expression 1. Conversely, it is clear from Expression 1 that when the resistance value $R_1$ of the resistor R1 is large, $V_{CS} \geq V_{th}$ is established even when the current $I_{M1}$ flowing through the resistor R1 is small.

Consequently, the resistance value $R_1$ of the sense resistor R1 is determined with consideration to this kind of relationship. That is, the resistance value $R_1$ of the sense resistor R1 is determined so that the product of the current $I_{M1}$ flowing through the sense transistor M1 and the resistance value $R_1$ of the sense resistor R1 is a value equal to or greater than the threshold voltage $V_{th}$ of the control transistor M2 when current of the overcurrent limit value flows from the main transistor M0.

In this way, the current limiting operating mode is entered when CS voltage $V_{CS}$ equal to or greater than the threshold voltage $V_{th}$ of the control transistor M2 is generated. Also, the circuit configuration is such that, in order for the CS voltage $V_{CS}$ to be equal to or greater than the threshold voltage $V_{th}$, it is necessary that the voltage between the power supply voltage terminal VCC of the IPS 100 and the output terminal OUT (the VCC-to-OUT voltage) is equal to or greater than the threshold voltage $V_{th}$.

For example, when the threshold voltage $V_{th}$ of the control transistor M2 is 1V, the current limiting operating mode is entered when CS voltage $V_{CS}$ equal to or greater than 1V is generated, but in this case, it is necessary that the VCC-to-OUT voltage is equal to or greater than 1V in order to cause CS voltage $V_{CS}$ equal to or greater than 1V to be generated.

Consequently, the second condition for the current limiting circuit 12 to drive in the current limiting operating mode is that the VCC-to-OUT voltage is equal to or greater than the threshold voltage $V_{th}$ of the control transistor M2.

To summarize the conditions for the current limiting circuit 12 of the IPS 100 to enter the current limiting operating mode, the conditions are that the current flowing from the main transistor M0 exceeds the overcurrent limit value, and that the VCC-to-OUT voltage is equal to or greater than the threshold voltage $V_{th}$ of the control transistor M2.

As the VCC-to-OUT voltage is equal to the drain-to-source voltage of the main transistor M0, the VCC-to-OUT voltage may be taken to be the drain-to-source voltage of the main transistor M0.

Problem to be Resolved

Next, the relationship between the overcurrent limit value and an inrush current will be described. FIG. 4 is a diagram showing the overcurrent limit value and inrush current. The vertical axis is current, while the horizontal axis is time.

An overcurrent limit value IOC (Incoming Overcurrent) is the threshold of the occurrence or otherwise of an overcurrent, as heretofore described. Consequently, a case wherein the value of the current flowing through the main transistor M0 is equal to or greater than the overcurrent limit value IOC is seen to be a state wherein a load short-circuit has occurred, causing an overcurrent.

Conversely, a case wherein the value of the current flowing through the main transistor M0 is less than the overcurrent limit value IOC is detected as not being an overcurrent.

Herein, it is assumed that the load 3 caused to operate by the IPS 100 is a motor. When current for causing the motor to operate is caused to flow from the IPS 100 from a time T1, an inrush current (starting current) is generated in a period between times T1 and T2, while current flows in a steady state from time T2 onward.

In this way, an electrical instrument that is an L load, such as a motor, has characteristics such that current called inrush current flows in a first time period, in which the flow of current is started (in which the motor is started up), while steady state current flows after a certain time elapses, and the instrument operates.

Meanwhile, it is preferable that the overcurrent limit value IOC is set as low as possible in order to prevent malfunction or destruction of peripheral parts due to battery voltage fluctuation or overcurrent conduction. Also, by the overcurrent limit value IOC being set low, the allowable conduction current of the device can be lowered, because of which high reliability, and cost reductions via chip size reduction and the like, are possible.

Figure 4:
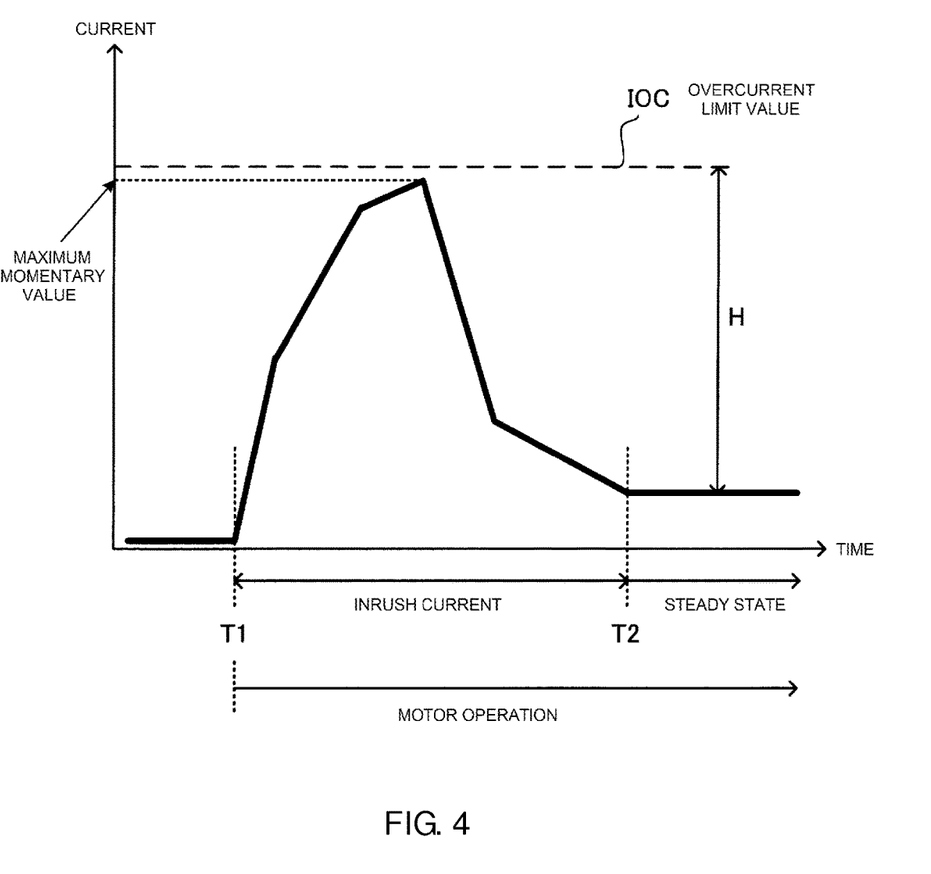
FIG. 4 is a diagram showing an overcurrent limit value and inrush current.

However, as the kind of inrush current shown in FIG. 4 flows when the motor is started up, the overcurrent limit value IOC has to be set higher than the maximum momentary value of the inrush current when setting the overcurrent limit value IOC.

This is because, as an electrical instrument such as a motor can start up stably by shifting to a steady state after the kind of inrush current shown in FIG. 4 flows, there is concern that the motor will not start up stably in the event that the inrush current is limited.

In the event that the overcurrent limit value IOC is set lower than the maximum momentary value of the inrush current, the inrush current exceeds the overcurrent limit value IOC, and the current limiting operating mode is entered when the motor is started up. Therefore, the inrush current that should flow is limited by the current limiting circuit 12, because of which a stable motor start-up cannot be carried out.

Consequently, the overcurrent limit value IOC is set higher than the maximum momentary value of the inrush current, but conversely, when this kind of setting is carried out, current generated in a range H between the current value when in a steady state and the maximum momentary value of the inrush current cannot be detected as the occurrence of an overcurrent. That is, there is a problem in that the overcurrent detection range is narrow, and the overcurrent detection accuracy decreases.

The invention, having been contrived in consideration of this point, provides a semiconductor device and current limiting method such that stable load start-up and an increase in overcurrent detection accuracy are achieved.

Second Embodiment

Figure 5:
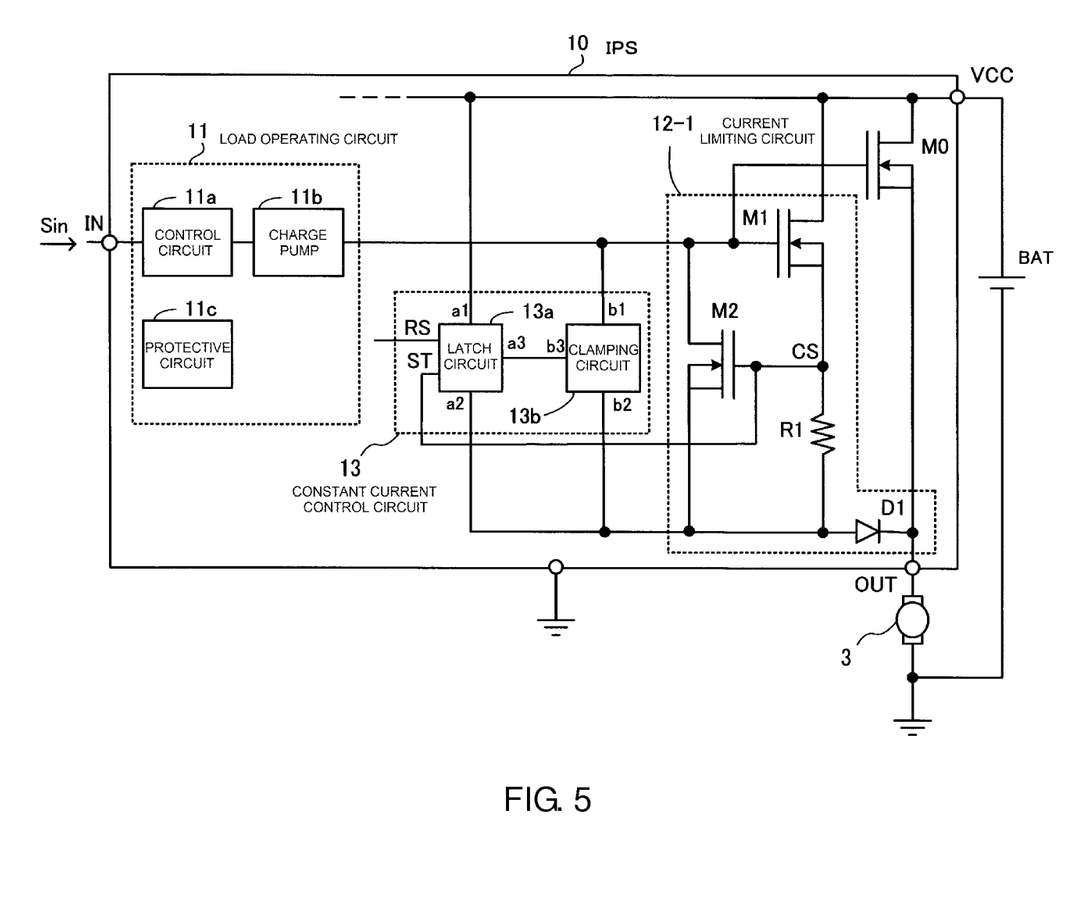
FIG. 5 is a diagram showing another configuration example of an IPS.

Next, a case wherein the semiconductor device of the invention is applied to an IPS will be described in detail. FIG. 5 is a diagram showing a configuration example of an IPS. An IPS 10 of a second embodiment includes the load operating circuit 11, a current limiting circuit 12-1, a constant current control circuit 13, and the main transistor M0.

Compared to the configuration of FIG. 2, the IPS 10 is of a configuration including the new current limiting circuit 12-1 and constant current control circuit 13 (constant current control unit). The current limiting circuit 12-1 includes the sense transistor M1, control transistor M2, resistor R1, and diode D1. Also, the constant current control circuit 13 includes a latch circuit 13a and a clamping circuit 13b.

The main transistor M0 corresponds to the main transistor m0 of FIG. 1, while the current limiting circuit 12-1 corresponds to the current limiting unit 1a of FIG. 1, and realizes the controls and functions of the current limiting unit 1a.

The constant current control circuit 13 clamps the gate voltage of the main transistor M0 at a voltage set in advance when an overcurrent occurs, and causes a constant current lower than the overcurrent to be stably output from the main transistor M0 based on the clamped setting voltage.

To describe the connection relationships of the elements in the current limiting circuit 12-1 and constant current control circuit 13, a terminal a1 of the latch circuit 13a is connected to the power supply voltage terminal VCC, the drain of the transistor M0, and the drain of the transistor M1.

A terminal a2 of the latch circuit 13a is connected to one end of the resistor R1, the source of the transistor M2, a terminal b2 of the clamping circuit 13b, and the anode of the diode D1.

A terminal a3 of the latch circuit 13a is connected to a terminal b3 of the clamping circuit 13b, while a set terminal ST of the latch circuit 13a is connected to the gate of the transistor M2, the source of the transistor M1, and the other end of the resistor R1.

A terminal b1 of the clamping circuit 13b is connected to the output port of the charge pump 11b, the drain of the transistor M2, and the gates of the transistors M0 and M1. The cathode of the diode D1 is connected to the source of the transistor M0 and one end of the load 3.

In this way, the current limiting circuit 12-1 and constant current control circuit 13 are of a configuration inserted between the power supply voltage terminal VCC and output terminal OUT and driven by the VCC-to-OUT voltage, which is the voltage between the power supply voltage terminal VCC and output terminal OUT.

Herein, the CS voltage $V_{CS}$ is input into the set terminal ST of the latch circuit 13a. Also, a reset signal is input into a reset terminal RS of the latch circuit 13a. For example, a latched state is reset by a reset signal being transmitted from upstream when the input signal Sin is input into the input terminal IN of the IPS 10.

When an overcurrent occurs, such as when the load short-circuits, the clamping circuit 13b clamps the gate voltage of the main transistor M0 at the setting voltage set in advance, thereby reducing the gate voltage.

Figure 6:
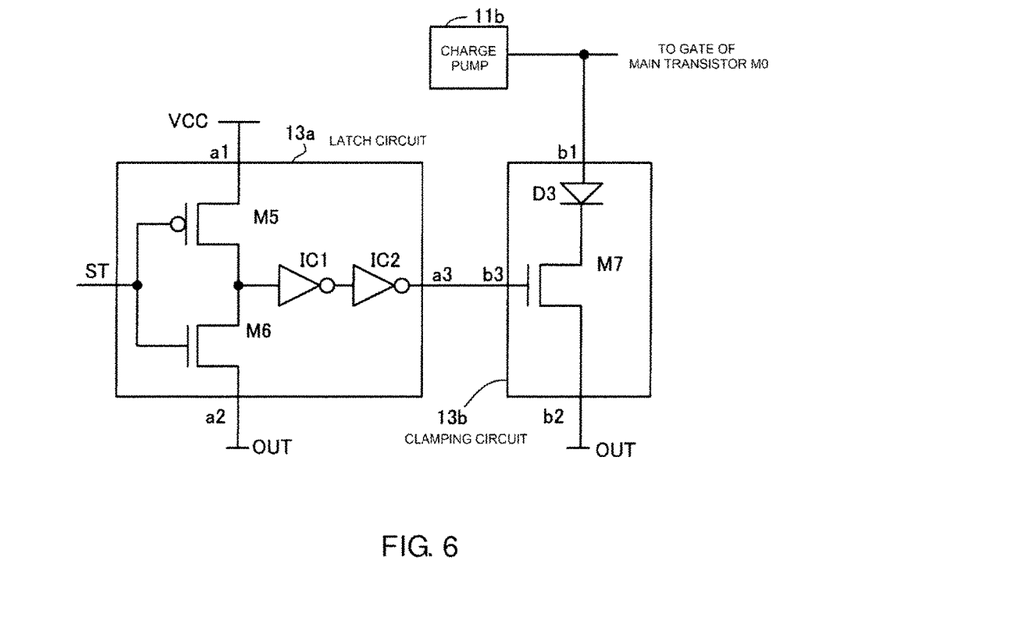
FIG. 6 is a diagram showing configuration examples of a latch circuit and a clamping circuit.

Next, an outline of the circuit configurations of the latch circuit 13a and clamping circuit 13b will be described. FIG. 6 is a diagram showing configuration examples of the latch circuit and clamping circuit. With regard to the latch circuit 13a, the circuit configuration in the periphery of the set terminal ST and terminals a1 to a3 is shown.

The latch circuit 13a includes a p-channel MOS transistor M5, an n-channel MOS transistor M6, and inverters IC1 and IC2. The clamping circuit 13b includes an n-channel MOS transistor M7 and a diode D3.

Regarding the element connection relationships, the set terminal ST of the latch circuit 13a is connected to the gate of the transistor M5 and the gate of the transistor M6. The source of the transistor M5 is connected via the terminal a1 to the power supply voltage terminal VCC of the IPS 10, and the source of the transistor M6 is connected via the terminal a2 to the anode of the diode D1 and the like, and connected to the output terminal OUT of the IPS 10.

The drain of the transistor M5 is connected to the drain of the transistor M6 and an input port of the inverter IC1. An output port of the inverter IC1 is connected to an input port of the inverter IC2, and an output port of the inverter IC2 is connected via the terminal a3 to the terminal b3 of the clamping circuit 13b.

The terminal b3 of the clamping circuit 13b is connected to the gate of the transistor M7. The drain of the transistor M7 is connected to the cathode of the diode D3, and the anode of the diode D3 is connected to the output port of the charge pump 11b, the gate of the main transistor M0, and the like. The source of the transistor M7 is connected via the terminal b2 to the anode of the diode D1 and the like, and connected to the output terminal OUT of the IPS 10.

Next, the operating voltage of the control transistor M2 in the current limiting circuits 12 and 12-1 will be described. Firstly, the operating voltage of the control transistor M2 in the current limiting circuit 12 shown in FIG. 2 will be described.

When an overcurrent flows from the main transistor M0, the control transistor M2 is turned on, thereby reducing the gate voltage of the main transistor M0. This means that the control transistor M2 is turned on when the current flowing from the main transistor M0 rises as far as the overcurrent limit value (when the current reaches the overcurrent limit value).

Consequently, a predetermined voltage generated at the gate of the control transistor M2 when the current flowing from the main transistor M0 rises as far as the overcurrent limit value may be assumed to be the threshold voltage $V_{th}$ of the control transistor M2, and by the predetermined voltage reaching the threshold voltage $V_{th}$, the control transistor M2 is turned on, and the current limiting operating mode is activated.

That is, the operating voltage of the control transistor M2 of the current limiting circuit 12 is equal to the predetermined voltage generated at the gate of the control transistor M2 when the current flowing from the main transistor M0 rises as far as the overcurrent limit value.

For example, when the threshold voltage $V_{th}$ of the control transistor M2 is 1V, the control transistor M2 is turned on by causing CS voltage $V_{CS}$ equal to or greater than 1V to be generated when an overcurrent occurs, because of which the predetermined voltage generated at the gate of the control transistor M2 when the current flowing from the main transistor M0 rises as far as the overcurrent limit value is 1V. Consequently, the operating voltage of the control transistor M2 is 1V.

Next, the operating voltage of the control transistor M2 in the current limiting circuit 12-1 will be described. The current limiting circuit 12-1 of FIG. 5 is of a configuration wherein the diode D1 is added on the source side of the control transistor M2.

This kind of configuration is such that a voltage that is the forward voltage (the voltage drop when current is caused to flow forward) of the diode D1 added to the predetermined voltage is necessary in order for the current limiting circuit 12-1 to enter the current limiting operating mode, that is, for the control transistor M2 to be turned on when an overcurrent occurs. Hereafter, the forward voltage of the diode D1 (hereafter, forward voltage Vf) will be referred to as correction voltage, and voltage that is the correction voltage added to the predetermined voltage will be referred to as current limiting activation voltage.

The current limiting activation voltage (the operating voltage for turning on the control transistor M2) is the sum of the threshold voltage $V_{th}$ of the control transistor M2 and the forward voltage Vf of the diode D1. The control transistor M2 is turned on by the diode D1 being energized, but the diode D1 is not energized, regarding turning on the control transistor M2 when an overcurrent occurs, unless the sum of the threshold voltage $V_{th}$ of the control transistor M2 and the forward voltage Vf of the diode D1 is generated at the point CS.

That is, the operating voltage necessary in order to turn on the control transistor M2 is attained when the voltage is equal to or greater than the current limiting activation voltage, which is the correction voltage added to the predetermined voltage generated at the gate of the control transistor M2 when the current flowing through the main transistor M0 rises as far as the overcurrent limit value.

For example, when the threshold voltage $V_{th}$ of the control transistor M2 is 1V and the forward voltage Vf of the diode D1 is 0.6V, the control transistor M2 is not turned on unless the gate voltage of the control transistor M2 of the current limiting circuit 12-1 reaches 1.6V or higher. The correction voltage can be changed to an arbitrary value by connecting diodes in a multiple-stage series.

In the description thus far, a diode is added, and voltage that is increased by an amount equivalent to the forward voltage of the diode is taken to be the operating voltage of the current limiting circuit 12-1, but it is also possible to lower the drain-to-source voltage of the main transistor M0 by using a large main transistor M0 instead of adding a diode.

Next, the operating voltage of the constant current control circuit 13 will be described. The latch circuit 13a is of a complementary metal-oxide-semiconductor (CMOS) configuration, as shown in FIG. 6, because of which, when the threshold voltage of each of the PMOS transistor M5 and NMOS transistor M6 is 1.5V, the operating voltage is the total 3V.

Also, when also adding the forward voltage Vf of the diode D1, the operating voltage is 3.6V. That is, the operating voltage of the latch circuit 13a is 3.6V or higher. The clamping circuit 13b operates at the same voltage as the latch circuit 13a. Consequently, a voltage that activates the constant current control circuit 13 (hereafter also called steady current generation voltage) needs to be 3.6V or higher.

Herein, the conditions for the current limiting circuit 12-1 and constant current control circuit 13 being activated will be summarized. Firstly, the first condition for the current limiting circuit 12-1 activating the current limiting function is that the current flowing through the main transistor M0 is equal to or greater than a current limit value. The current limit value is a threshold for determining that a current greater than the operating current when the load 3 operates in a steady state is flowing.

Furthermore, the second condition is that the operating voltage when turning on the control transistor M2 is equal to or greater than a current limiting activation voltage, which is a correction voltage added to the predetermined voltage generated at the gate of the control transistor M2 when the current flowing through the main transistor M0 rises as far as the current limit value. When these two conditions are met, the current limiting circuit 12-1 detects that an overcurrent is flowing from the main transistor M0, and activates the current limiting function.

Meanwhile, the first condition for the constant current control circuit 13 being activated is that the current flowing through the main transistor M0 is equal to or greater than the current limit value. Furthermore, the second condition is that the operating voltage of the constant current control circuit 13 is equal to or greater than a steady current generation voltage set higher than the current limiting activation voltage.

When these two conditions are met, the constant current control circuit 13 clamps the gate voltage of the main transistor M0 at the setting voltage, and causes a constant current lower than the overcurrent to be output from the main transistor M0 based on the clamped setting voltage.

Next, operations of the IPS 10 will be described in further detail, divided into an operation when starting up a motor when no load short-circuit is occurring, and an operation when there is a load short-circuit.

Figure 7:
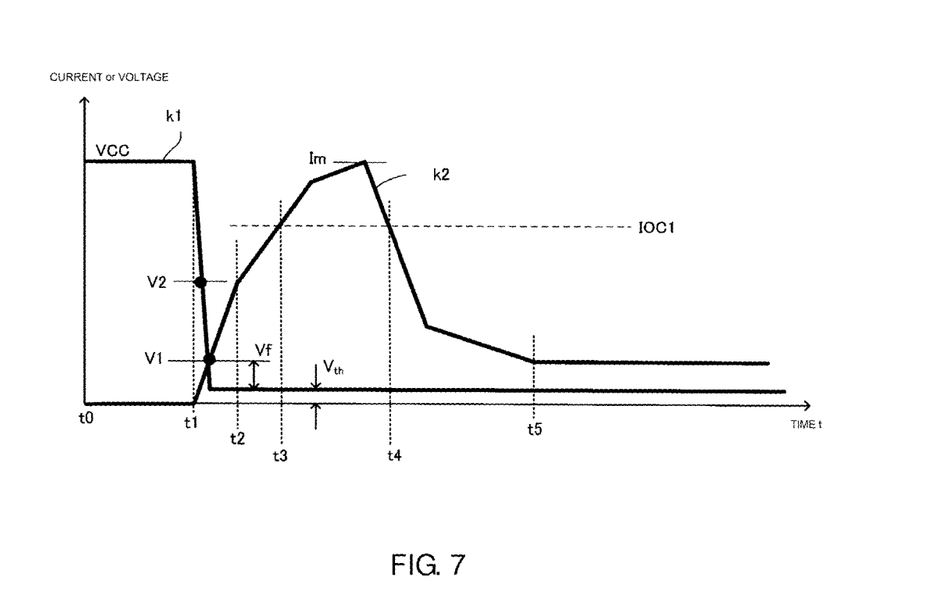
FIG. 7 is a diagram showing operating waveforms when starting up a motor when no load short-circuit is occurring.

FIG. 7 is a diagram showing operating waveforms when starting up a motor when no load short-circuit is occurring. The vertical axis is current or voltage, while the horizontal axis is time t. Graph k1 is the transition of a drain-to-source voltage VDS of the main transistor M0. Graph k2 is the transition of the current flowing through the main transistor M0.

The operating voltage for the control transistor M2 in the current limiting circuit 12-1 to be turned on and the current limiting circuit 12-1 to enter the current limiting operating mode is, as heretofore described, a predetermined voltage (the threshold voltage $V_{th}$ of the control transistor M2) added to a correction voltage (the forward voltage Vf of the diode D1). Also, the circuit configuration of the IPS 10 is such that the operating voltage is equal to the VCC-to-OUT voltage, and equal to the drain-to-source voltage VDS. Hereafter, a description will be given assuming the operating voltage to be the drain-to-source voltage VDS.

When t0≤t<t1, the state is such that the motor is not operating, and the main transistor M0 is in an off-state. Consequently, the power supply voltage VCC is applied directly to the drain-to-source voltage VDS of the main transistor M0, so that VDS=VCC. Also, the current flowing from the main transistor M0 is zero.

When t=t1, the input signal Sin is input via the input terminal IN of the IPS 10, and motor start-up is started. As the motor is an L load, induced electromotive force V is expressed as V=L·(di/dt) (L is inductance, and di/dt is the amount of current change with respect to time).

When t1<t≤t2, the on-state resistance of the main transistor M0 decreases when current flows through the motor, and the drain-to-source voltage VDS is used as the induced electromotive force V of the motor. Consequently, the drainto-source voltage VDS starts to decrease sharply. Also, an inrush current starts to flow from the main transistor M0, and the current value rises.

When t2<t<t3, the drain-to-source voltage VDS (corresponding to a first drain-to-source voltage) drops approximately as far as the threshold voltage $V_{th}$ of the control transistor M2. Also, the rise of the inrush current continues.

When t3≤t≤t4, the drain-to-source voltage VDS maintains the value of the threshold voltage $V_{th}$. Also, as a current limit value IOC1 (corresponding to the current limit value Ith of FIG. 1) is set lower than a maximum momentary value Im of the inrush current, the maximum momentary value Im of the inrush current exceeds the current limit value IOC1. Also, the drain-to-source voltage VDS is approximately equal to the threshold voltage $V_{th}$.

When considering the case of the IPS 100 of FIG. 2, the conditions for entering the current limiting operating mode are met in this state, because of which current limitation is applied with respect to the main transistor M0, and the inrush current is limited.

As opposed to this, the case of the IPS 10 of the invention shown in FIG. 5 is such that even though the overcurrent is equal to or greater than the current limit value IOC1, the drain-to-source voltage VDS is lower than the current limiting activation voltage V1, and furthermore, lower than a steady current generation voltage V2 (VDS<V1, VDS<V2). Therefore, the conditions for the current limiting circuit 12-1 entering the current limiting operating mode are not met, and the conditions for the constant current control circuit 13 being activated are not met either.

That is, as VDS<V1, the current limiting circuit 12-1 does not shift to the current limiting operating mode, and as VDS<V2, the constant current control circuit 13 is not activated either. Consequently, even when the value of the current flowing through the main transistor M0 is equal to or greater than the current limit value IOC1, no limitation is applied to the inrush current at the time.

When t4<t≤t5, the drain-to-source voltage VDS maintains the value of the threshold voltage $V_{th}$. Also, the inrush current decreases.

When t5<t, the drain-to-source voltage VDS maintains the value of the threshold voltage $V_{th}$. The state wherein the inrush current flows is finished, there is a shift to the steady state, and the predetermined current flows from the main transistor M0.

In this way, the operation when starting up a motor when no load short-circuit is occurring is such that, as the drain-to-source voltage VDS is used as the induced electromotive force of the motor, barely any voltage is applied between the power supply voltage terminal VCC of the IPS 10 and the output terminal OUT (this is because voltage is applied to the L component of the motor).

Consequently, even when the inrush current is equal to or greater than the current limit value IOC1, no voltage such that exceeds the current limiting activation voltage V1 or steady current generation voltage V2 is applied to the current limiting circuit 12-1 or constant current control circuit 13, because of which there is no shift to the current limiting operating mode, and constant current generation control is not activated either. Therefore, no current limitation is applied to the inrush current, because of which a motor inrush current that exceeds the current limit value IOC1 can be caused to flow.

Figure 8:
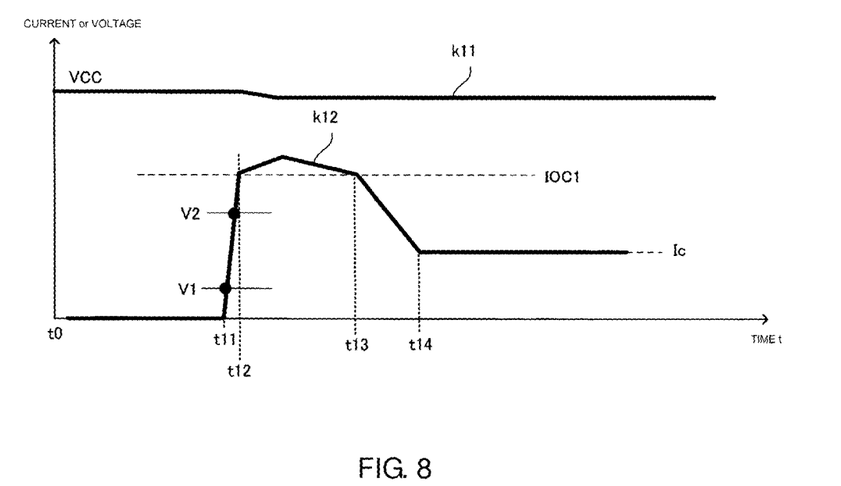
FIG. 8 is a diagram showing operating waveforms when there is a load short-circuit.

FIG. 8 is a diagram showing operating waveforms when there is a load short-circuit. The vertical axis is current or voltage, while the horizontal axis is time t. Graph k11 is the transition of the drain-to-source voltage VDS (corresponding to a second drain-to-source voltage) of the main transistor M0. Graph k12 is the transition of the current flowing through the main transistor M0.

When t0≤t<t11, the state is such that the motor is not operating, and the main transistor M0 is in an off-state. Consequently, the power supply voltage VCC is applied directly to the drain-to-source voltage VDS of the main transistor M0, so that VDS=VCC. Also, the current flowing from the main transistor M0 is zero.

When t=t11, it is assumed that a load short-circuit occurs, and the input signal Sin is input via the input terminal IN of the IPS 10 when in the state wherein the load is short-circuited. As the load is short-circuited, the output terminal OUT is of the GND potential, because of which the power supply voltage VCC is applied to the drain-to-source voltage VDS.

When t11<t<t12, the load is short-circuited, and the drain-to-source voltage VDS is approximately equal to the power supply voltage VCC. Also an overcurrent flows from the main transistor M0, and the current value rises.

When t=t12, there is a load short-circuit state, and the drain-to-source voltage VDS practically maintains the value of the power supply voltage VCC. Also, the overcurrent reaches the current limit value IOC1.

At this time, the drain-to-source voltage VDS is equal to or higher than the current limiting activation voltage V1, and furthermore, equal to or higher than the steady current generation voltage V2 (VDS≥V1, VDS≥V2), and the overcurrent is equal to or higher than the current limit value IOC1.

As VDS≥V1, the current limiting circuit 12-1 shifts to the current limiting operating mode. Also, as VDS≥V2, the constant current control circuit 13 is activated.

When t12<t≤t13, there is a load short-circuit state, and the drain-to-source voltage VDS practically maintains the value of the power supply voltage VCC. The current limiting circuit 12-1 is in the current limiting operating mode, and the control transistor M2 is turned on, thereby causing the gate voltage of the main transistor M0 to decrease, because of which the current flowing through the main transistor M0 decreases.

When t13<t≤t14, there is a load short-circuit state, and the drain-to-source voltage VDS practically maintains the value of the power supply voltage VCC. The constant current control circuit 13 causes the gate voltage of the main transistor M0 to decrease considerably until the value of the current flowing from the main transistor M0 reaches a preset constant current Ic. The constant current control circuit 13 operates after a certain time delay after being activated at time t12.

When t14<t, there is a load short-circuit state, and the drain-to-source voltage VDS practically maintains the value of the power supply voltage VCC. The constant current Ic flows from the main transistor M0 owing to the control by the constant current control circuit 13.

In this way, the operation when there is a load short-circuit is such that the load 3 short-circuits, an overcurrent flows, and when the overcurrent is equal to or higher than the current limit value IOC1, and the drain-to-source voltage VDS is equal to or higher than the current limiting activation voltage V1, the gate voltage of the main transistor M0 is lowered. Therefore, the current flowing through the main transistor M0 is limited by the on-state resistance of the main transistor M0 increasing.

Also, when the drain-to-source voltage VDS becomes equal to or greater than the steady current generation voltage V2 simultaneously with the above, the latch circuit 13a and clamping circuit 13b in the constant current control circuit 13 are activated.

Therefore, the gate voltage of the main transistor M0 is swiftly clamped at the setting voltage, because of which a constant current based on the setting voltage can be output from the main transistor M0, and the current can be limited to a current stably lowered as far as the desired value.

As heretofore described, the operating voltages of the current limiting circuit 12-1 and constant current control circuit 13 are set high so that the current limiting circuit 12-1 and constant current control circuit 13 do not operate at the VCC-to-OUT voltage in a state wherein an inrush current occurs.

Therefore, no limit is applied to the inrush current even when the overcurrent is equal to or higher than the current limit value, because of which the load can be stably started up. Also, as the current limit value can be set lower than the maximum momentary value of the inrush current, the overcurrent detection range can be increased, and an increase in overcurrent detection accuracy can be achieved.

According to the invention, as heretofore described, the current limit value can be set lower than the maximum momentary value of the inrush current, because of which malfunction or destruction of peripheral parts due to battery voltage fluctuation or overcurrent conduction when there is a load short-circuit can be prevented.

Also, by the current limit value being set low, high reliability can be ensured, and the rated conduction current of the power semiconductor element can be lowered, even when there is a load short-circuit. Furthermore, reduction in the chip size of the power semiconductor element and the like is also possible, which can contribute to cost reductions. Furthermore, as there is no effect on the inrush current when starting up the load, stable load start-up is possible.

Heretofore, embodiments have been given as examples, but the configuration of each portion shown in the embodiments can be replaced by another configuration having the same function. Also, other optional components or steps may be added.

What is claimed is:

1. A semiconductor device, comprising:
   a main transistor configured to carry out a supply of power from a power source to a load; and
   a current limiting device, including a control transistor that is configured to control a gate voltage of the main transistor, and that has a current limiting function for limiting a current flowing through the main transistor, the control transistor having a source, a drain and a gate, wherein
   the current limiting device is configured to detect that the current is an overcurrent, and
     to activate the current limiting function, upon determining that
       the current is equal to or greater than a current limit value, and
       an operating voltage of the control transistor is equal to or greater than a current limiting activation voltage, wherein
         the current limit value is a threshold for determining whether the current is greater than an operating current of the main transistor for the load to operate in a steady state, and is set lower than a maximum momentary value of an inrush current occurring when the load is started up, and
         the current limiting activation voltage is a sum of a correction voltage and a predetermined threshold voltage at the gate of the control transistor when the current rises to the current limit value, and
     not to activate the current limiting function upon detecting that the operating voltage of the control transistor is lower than the current limiting activation voltage, even when the inrush current is equal to or greater than the current limit value.

2. The semiconductor device according to claim 1, wherein
   the main transistor is an NMOS (N-type Metal-Oxide-Semiconductor) transistor that has a source, a drain and a gate, the drain of the main transistor being connected to the power source and the source of the main transistor being connected to the load,
   the current limiting activation voltage is set higher than a first drain-to-source voltage generated in the main transistor when an inrush current occurs at start-up of the load, and
   the current limiting activation voltage is set lower than a second drain-to-source voltage generated in the main transistor when the load short-circuits.

3. The semiconductor device according to claim 2, wherein
   the current limiting device includes the control transistor, a resistor, a diode having an anode and a cathode, and a sense transistor having a source, a drain and a gate, and
   the sense transistor and control transistor are NMOS transistors, the gate of the sense transistor being connected to the gate of the main transistor, the drain of the control transistor and the drain of the sense transistor being connected to the power source, the source of the sense transistor being connected to the gate of the control transistor and one end of the resistor, the source of the control transistor being connected to the other end of the resistor and the anode of the diode, and the cathode of the diode being connected to the source of the main transistor and to one end of the load.

4. The semiconductor device according to claim 3, wherein
   the current limiting device is configured to add a forward voltage of the diode to the predetermined threshold voltage as the correction voltage, thereby forming the current limiting activation voltage.

5. The semiconductor device according to claim 3, wherein
   the diode includes a plurality of diodes connected in series, and
   the current limiting device is configured to add a forward voltage of the plurality of diodes to the predetermined threshold voltage as the correction voltage, thereby forming the current limiting activation voltage.

6. The semiconductor device according to claim 1, further comprising
   a constant current control device configured to, upon detection of the overcurrent, clamp the gate voltage of the main transistor at a voltage set in advance, and cause a constant current lower than the overcurrent to be output from the main transistor based on the clamped voltage.

7. The semiconductor device according to claim 6, wherein
   the constant current control device is activated when the current flowing through the main transistor is equal to or greater than the current limit value, and an operating voltage of the constant current control device is equal to or greater than a steady current generation voltage set higher than the current limiting activation voltage.

8. A method for a current limiting device, including a control transistor having a source, a drain and a gate, to limit a current flowing through a main transistor that carries out a supply of power from a power source to a load, comprising:

setting a current limit value, which is a threshold for determining whether the current flowing through the main transistor is greater than an operating current of the main transistor for the load to operate in a steady state, and is set lower than a maximum momentary value of an inrush current occurring when the load is started up; and detecting that the current is an overcurrent, and
activating a current limiting function of the current limiting device to limit the current, upon determining that
the current is equal to or greater than the current limit value, and
an operating voltage of the control transistor is equal to or greater than a current limiting activation voltage, wherein
the current limiting activation voltage is a sum of a correction voltage and a predetermined threshold voltage at the gate of the control transistor when the current rises to the current limit value, and
not activating the current limiting function upon detecting that the operating voltage of the control transistor is lower than the current limiting activation voltage, even when the inrush current is equal to or greater than the current limit value.

9. A semiconductor device, comprising:
a first transistor, connected to a power source and a load, for supplying power from the power source to the load; and
a current limiting device, including a second transistor having a source, a drain and a gate, connected to the main transistor, the current limiting device being configured
to detect a current flowing through the first transistor to the load,
to ascertain an operating voltage of the second transistor, and
to limit the current upon determining that
the detected current is no smaller than a current threshold, and
the ascertained operating voltage is no smaller than a current limiting activation voltage, wherein
the current threshold is a threshold below which the current flowing through the first transistor to the load operates the load in a steady state, and is set lower than a maximum momentary value of an inrush current occurring when the load is started up,
the current limiting activation voltage is a sum of a voltage at the gate of the second transistor when the current reaches the current threshold, and a correction voltage thereof, and
the current limiting device does not limit the current upon detecting that the operating voltage of the second transistor is lower than the current limiting activation voltage, even when the inrush current is equal to or greater than the current threshold.

* * * * *